(12) United States Patent
Munroe et al.

(10) Patent No.: US 9,360,317 B2
(45) Date of Patent: Jun. 7, 2016

(54) LASER DETECTION SYSTEM AND METHOD FOR A ROTARY LASER LEVEL

(71) Applicants: Robert Bosch Tool Corporation, Broadview, IL (US); Robert Bosch GmbH, Stuttgart (DE)

(72) Inventors: Jay R. Munroe, Watseka, IL (US); Nathan J. Light, Sheldon, IL (US); Antony J. Wilks, Watseka, IL (US)

(73) Assignee: Robert Bosch GmbH, Stuttgart (DE)

( * ) Notice: Subject to any disclaimer, the term of this patent is extended or adjusted under 35 U.S.C. 154(b) by 200 days.

(21) Appl. No.: 14/141,771

(22) Filed: Dec. 27, 2013

(65) Prior Publication Data

US 2014/0203172 A1 Jul. 24, 2014

Related U.S. Application Data

(60) Provisional application No. 61/747,254, filed on Dec. 29, 2012, provisional application No. 61/786,269, filed on Mar. 14, 2013, provisional application No. 61/786,239, filed on Mar. 14, 2013.

(51) Int. Cl.
*G01C 15/00* (2006.01)
*G01C 9/02* (2006.01)
*G08B 13/14* (2006.01)
(Continued)

(52) U.S. Cl.
CPC .............. *G01C 15/006* (2013.01); *G01B 11/26* (2013.01); *G01C 9/02* (2013.01); *G01J 1/44* (2013.01); *G08B 13/14* (2013.01); *H03F 1/0277* (2013.01);
(Continued)

(58) Field of Classification Search
CPC ........ G01B 11/26; G01C 15/006; G01C 9/02; G01J 1/44; G08B 13/14; H03F 1/0277; H03F 2200/435; H03F 3/087
See application file for complete search history.

(56) References Cited

U.S. PATENT DOCUMENTS 7,012,237 B1 * 3/2006 Ake ................... H03F 3/08
250/214 A
7,838,808 B1 11/2010 Ake
(Continued)

FOREIGN PATENT DOCUMENTS

EP 1777496 A2 4/2007
JP 2002328006 A 11/2002

OTHER PUBLICATIONS

International Search Report and Written Opinion corresponding to PCT Application No. PCT/US2013/078033, mailed Apr. 10, 2014 (12 pages).

*Primary Examiner* — Francis M Legasse, Jr.
(74) *Attorney, Agent, or Firm* — Maginot Moore & Beck LLP

(57) ABSTRACT

A method of detecting a laser beam emitted by a laser tool includes receiving light via an optical window of a receiver unit, and directing the light received via the optical window onto a first light sensor array and a second light sensor array. At least one signal is output from the first light sensor array indicating a characteristic of the light incident upon the first light sensor array. At least one signal is output from the second light sensor array indicating a characteristic of the light incident upon the second light sensor array. The at least one signal from the first light sensor array and the at least one signal from the second light sensor array are processed with respect to each other to produce a measurement signal. A determination is then made whether the received light is a laser beam emitted by the laser tool based on the measurement signal.

7 Claims, 18 Drawing Sheets

(51) Int. Cl.
*H03F 1/02* (2006.01)
*H03F 3/08* (2006.01)
*G01B 11/26* (2006.01)
*G01J 1/44* (2006.01)

(52) U.S. Cl.
CPC .......... *H03F 3/087* (2013.01); *H03F 2200/435* (2013.01)

(56) References Cited

U.S. PATENT DOCUMENTS

2002/0038845 A1  4/2002  Yamazaki et al.
2006/0067712 A1  3/2006  Draper et al.
2011/0090481 A1  4/2011  Snyder

* cited by examiner

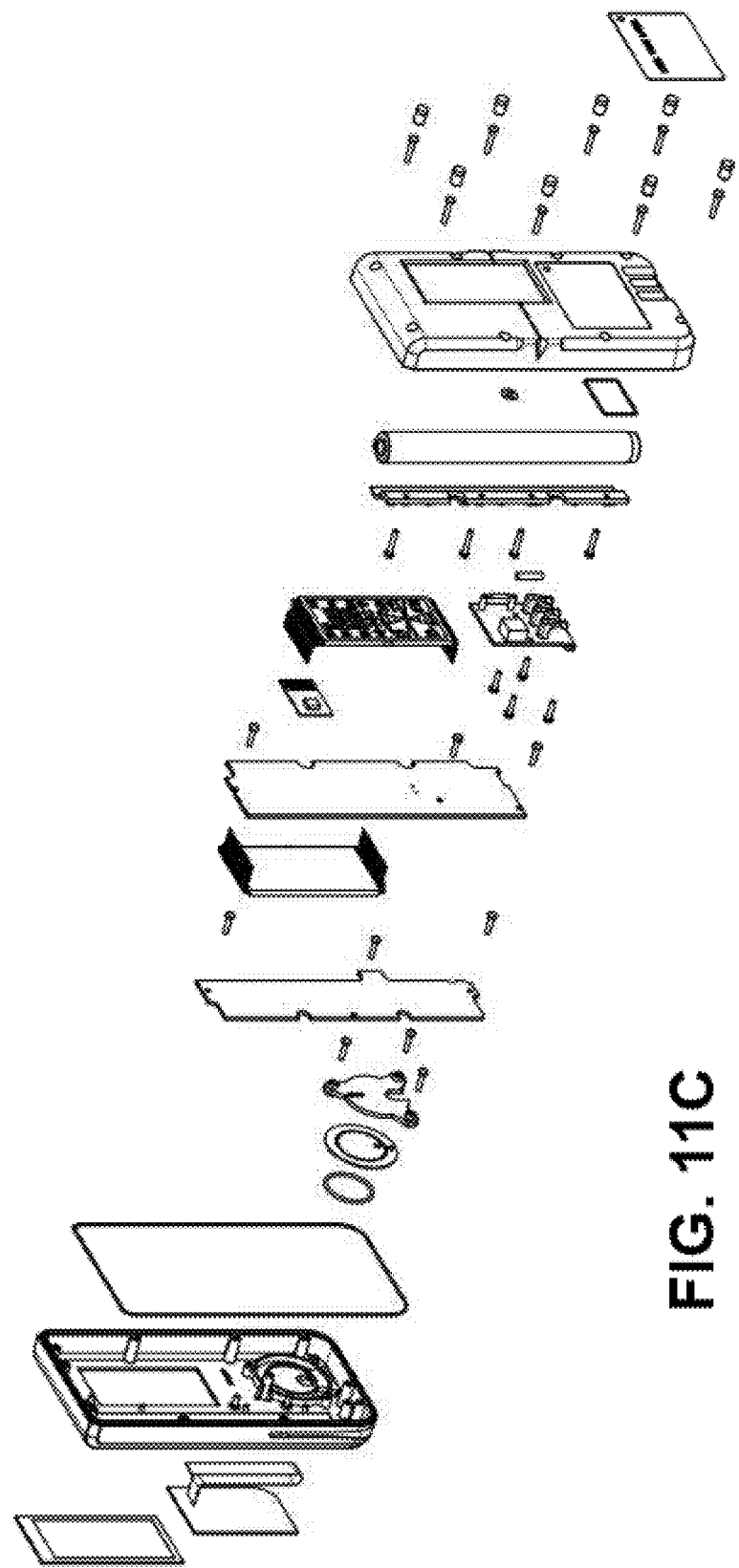

LASER DETECTION SYSTEM AND METHOD FOR A ROTARY LASER LEVEL

CROSS-REFERENCE TO RELATED APPLICATIONS

This application claims priority to U.S. Provisional Application Ser. No. 61/747,254 entitled "Rotary Laser Level" by Munroe et al., filed Dec. 29, 2012, U.S. Provisional Application Ser. No. 61/786,269 entitled "Rotary Laser Level" by Munroe et al., filed Mar. 14, 2013, and U.S. Provisional Application Ser. No. 61/786,239 entitled "Rotary Laser Level" by Munroe et al., filed Mar. 14, 2013, the disclosures of which are hereby incorporated herein by reference in their entirety.

TECHNICAL FIELD

The present disclosure relates generally to laser levels and in particular to rotary laser levels.

BACKGROUND

Rotary laser levels are measurement and layout tools that are configured to project a laser beam in a complete 360° circle. Positioning a rotary laser level in the center of a room or work area enables a level laser line to be projected around the entire room or work area. This enables all types of work to be performed including site grading, laying out foundations for building construction, installing drop-ceilings, pouring concrete, installing chair rails, installing fences, and more. Rotary laser levels are either of the manual or automatic leveling type. Manual leveling requires that the operator manually adjust the level of the laser beam to achieve level positioning. In rotary laser levels with automatic leveling, the laser assembly is typically mounted on a pendulum arrangement and is configured to use gravity and/or a leveling mechanism, such as a servo-motor, to achieve level positioning.

Some rotary laser levels are configured to work with a remote unit. The remote unit is capable of controlling the operation of the laser level remotely so that a single person can operate the laser level. The remote unit may also include a laser detector or receiver. This facilitates the detection of the laser beam outdoors, and also allows other information to be determined, such as horizontal and vertical reference positions, and distance measurements.

There are a number of issues that are faced in the using and caring for rotary laser levels. For example, rotary laser levels are valuable tools which make them a target for thieves. In addition, they require a high degree of accuracy which may require regular servicing and calibration checks to maintain. Because the remote/receiver unit is a separate device from the base unit, care must be taken to ensure that the remote/receiver unit does not become misplaced and that the remote/receiver unit is charged.

DRAWINGS

FIG. 11C depicts a second exploded view of the receiver unit of FIG. 11A.

DESCRIPTION

Figure 1:
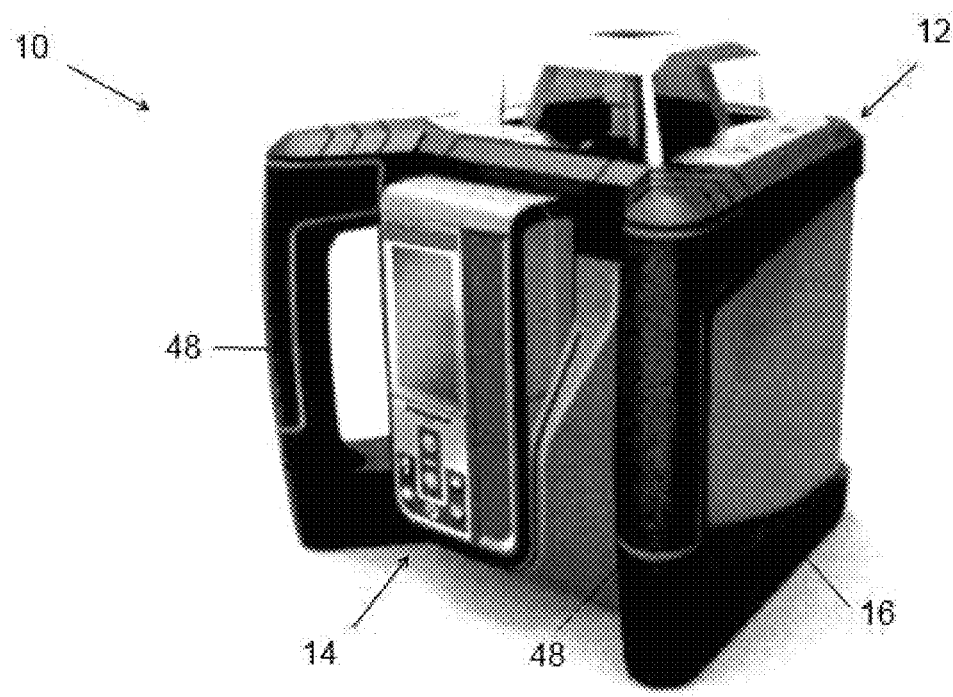
FIG. 1 depicts a perspective view of a rotary laser level system in accordance with the present disclosure with the receiver unit of the system docked to the base unit.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

Figure 2:
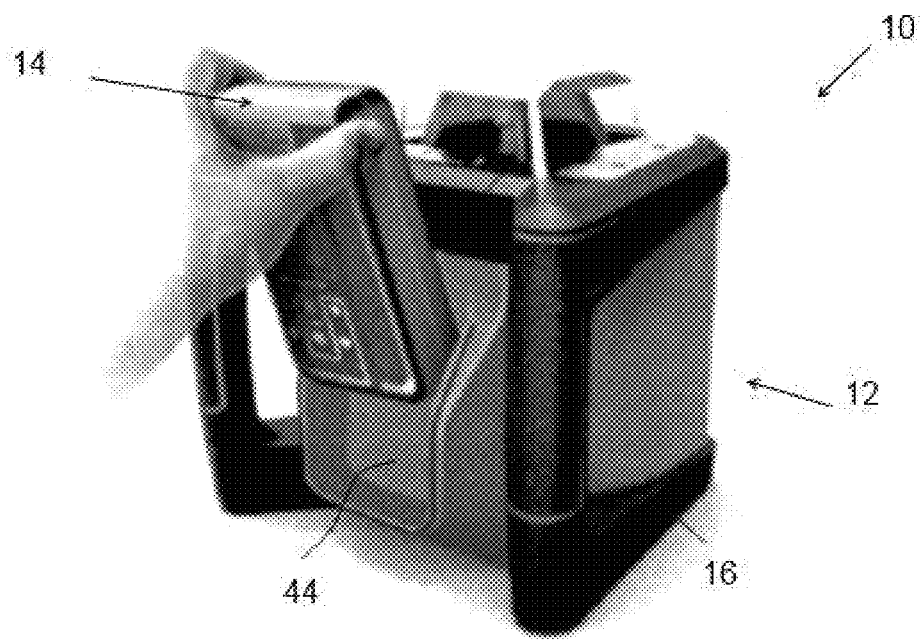
FIG. 2 depicts a perspective view of the rotary laser level system of FIG. 1 with the receiver unit being removed from the base unit.

The present disclosure is directed to a rotary laser level system 10 that has a plurality of new and useful features, such as receiver docking, theft prevention and detection, calibration reminders, partially automated calibration, and flatter bandwidths, which are described in more detail below. Referring to FIGS. 1-3, the rotary laser level system 10 includes a base unit 12 and a receiver unit 14. The base unit 12 comprises a housing 16 formed of a suitable hard, durable material, such as molded plastic. In the embodiment of FIGS. 1-4, the housing 16 includes a front side portion 18, a rear side portion 20, a left side portion 22, a right side portion 24, a top portion 26, and a bottom portion 28 that collectively surround and define an interior enclosure space. The housing 16 has a generally cubic shape although any suitable shape may be used.

Figure 4:
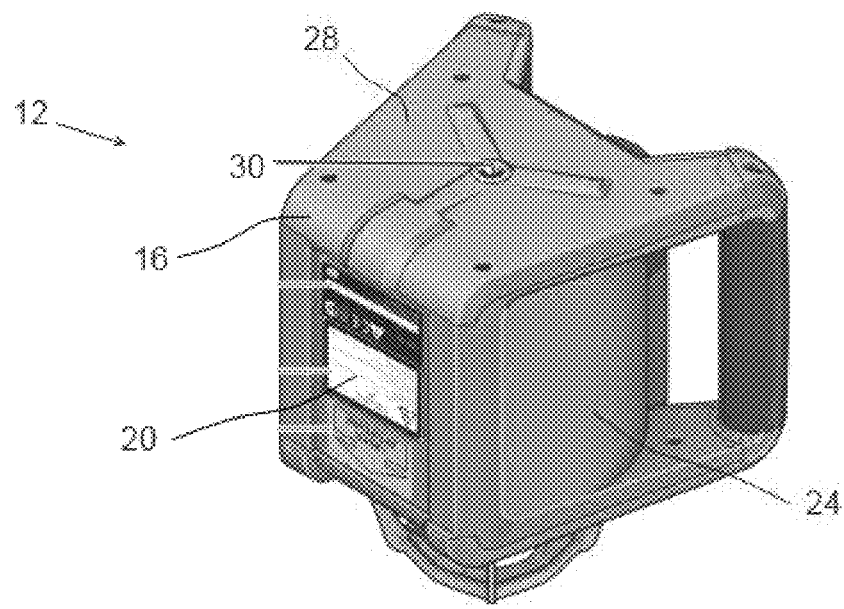
FIG. 4 depicts a bottom perspective view of the base unit.
Figure 5:
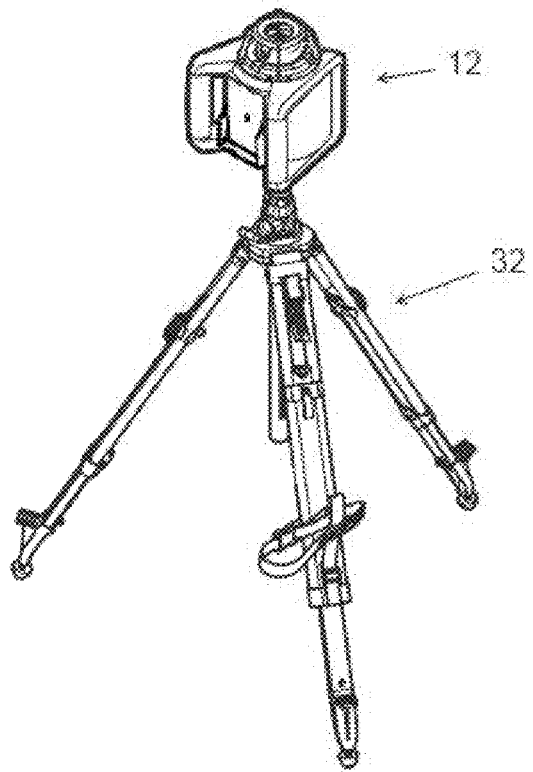
FIG. 5 depicts a perspective view of the base unit mounted on a tripod.

Referring to FIGS. 4 and 5, the bottom portion 28 of the housing 16 is configured to be placed against a surface, such as a floor or ground. The bottom portion 28 may include mounting features, such as mounting openings 30, that enable the base unit 12 to be mounted to a tripod 32 as depicted in FIG. 5, or to a wall bracket (not shown), or other type of support structure. When the housing 16 is positioned with the bottom portion facing downwardly, the base unit 12 is in a horizontal position (defined by the orientation of the laser assembly). The housing 16 may also be configured for operation in a vertical position by positioning the housing 16 with one of the sides facing downwardly. For example, in one embodiment, the rear portion 20 of the housing may be configured to be placed on the floor or on the ground so the base unit 12 can be operated in a vertical position.

Figure 3A:
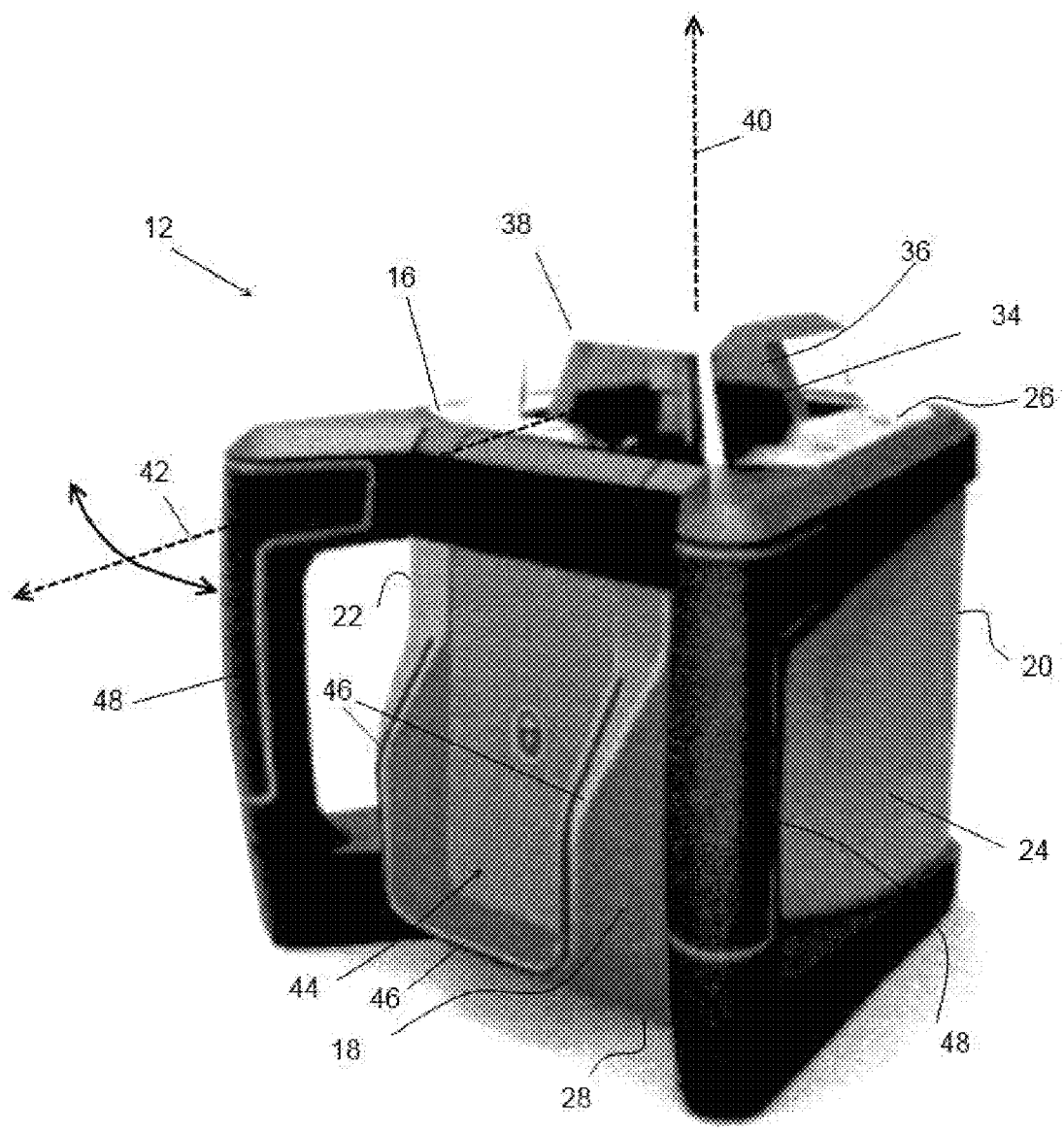
FIG. 3A depicts a perspective view of the base unit of the rotary laser level system of FIG. 1 with the receiver unit removed.
Figure 3B:
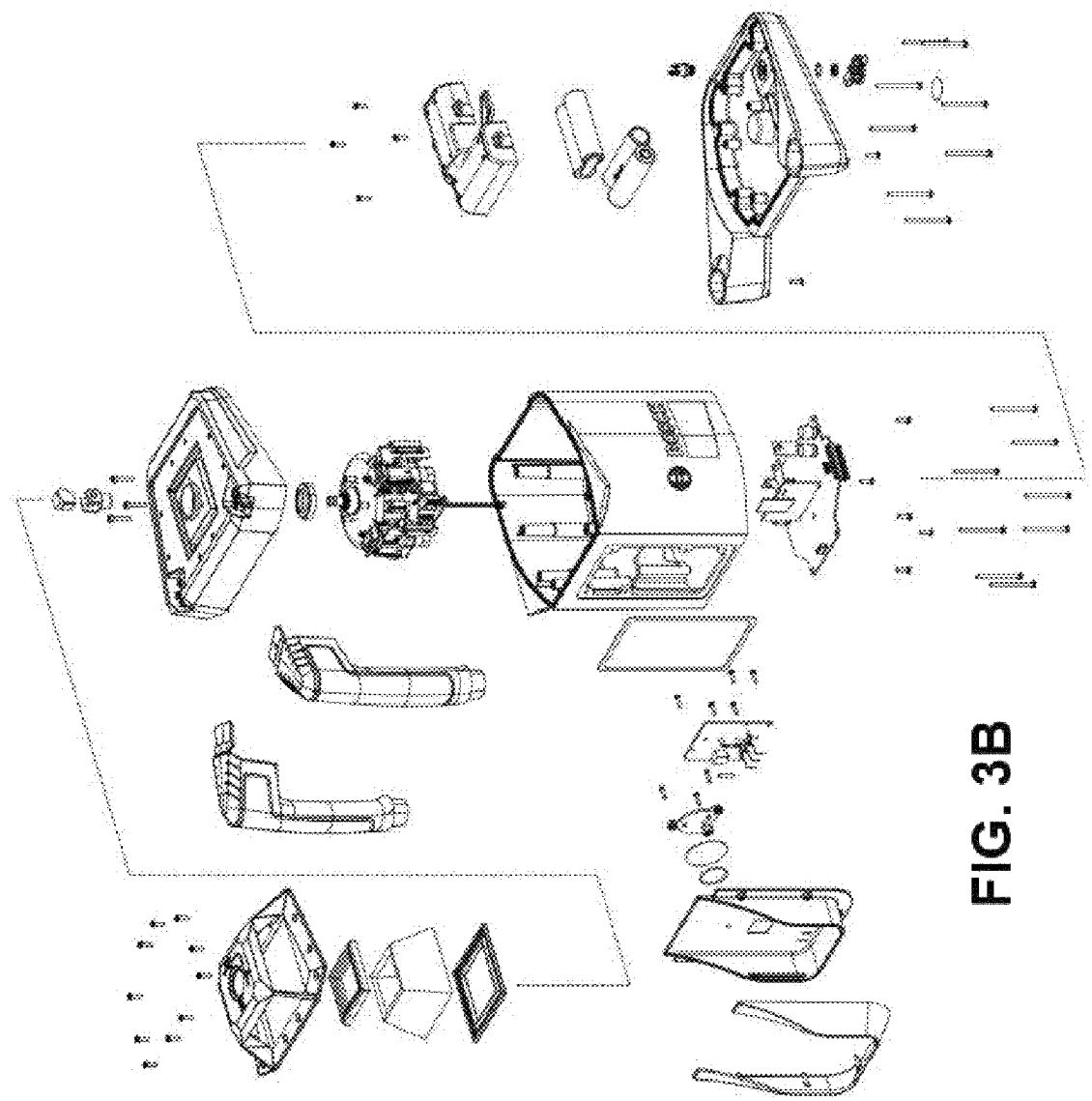
FIG. 3B depicts an exploded view of the base unit of FIG. 3A.

Referring to FIGS. 3A and 3B, the top portion 26 of the housing 16 defines an opening through which the rotating head portion 34 of a laser assembly extends. A transparent cap 36 is positioned over the head portion 34, and a protective cage 38 is mounted to the top portion over the cap 36. Transparent windows are provided in the cap 36 to enable the laser beams 40, 42 from the laser assembly to emanate out of the housing 12. The protective cage 38 may be removably attached to the housing 12 to provide access to the head portion 34 of the rotary laser so the laser beam can be manipulated by an operator, e.g., to manually position the laser beam on a known point or work area.

The front portion 18 of base unit 12 includes a docking position 44 for removably attaching the receiver unit 14 to the base unit 12. As depicted in FIG. 2, the docking position 44 includes support walls and/or surfaces 46 that surround the docking position 44. Docking features (not visible) are provided in the docking position 44 for removably retaining the receiver unit 14. The docking features may have any suitable configuration that enables the receiver unit 14 to be operably and removably retained on the base unit 12. Complementary docking features are provided on the receiver unit 14. In one embodiment, the docking features on the base unit 12 and the receiver unit 14 comprise rail and groove guide structures that are configured to cooperate to removably retain the receiver unit 14 in the docking position 44 on the base unit 12.

The base unit 12 includes two carrying handles 48 that project forwardly from the housing 12 near each side of the front portion 18. Each carrying handle has a generally U-shaped configuration with an upper attachment portion extending from an upper portion of the housing and a lower attachment portion extending from a lower portion of the housing. Ergonomic grip portions extend between the upper and lower attachment portions to facilitate carrying the base unit 12. The carrying handles also serve to protect the docking position 44 on the front portion 18, and the receiver unit 14 if docked to the base unit 12, from impacts and falls.

Referring to the block diagram of FIG. 6, the internal components of the base unit 12 include a rotary laser assembly 50, a power system 52, a communication system 54, a control system 56, and various sensors and indicators 58 (explained in more detail below). In one embodiment, the control system 56, power system, and sensors 58 are implemented on the same printed circuit board PCB A.

The rotary laser assembly 50 is operably mounted within the housing 12 and includes a self-leveling support (not shown) and a laser module (not shown). In one embodiment, the self-leveling support structure comprises a pendulum arrangement that is movably mounted within the housing. The pendulum arrangement is configured to automatically assume a predetermined orientation based on the inclination of the housing to provide a reference position for the control system. For example, the pendulum arrangement may be configured to use gravity and/or to use a leveling device, such as a servo-motor, to automatically level the pendulum arrangement relative to the orientation of the housing. Self-leveling occurs automatically each time the housing is repositioned so long as the housing is stably supported and not inclined more than a predefined amount, e.g., 8%, relative to horizontal.

The laser module is incorporated into the rotating head portion 34 that is rotatably mounted to the support structure. The laser module is configured to generate a plumb laser beam 40 and a rotary laser beam 42. The plumb laser beam 40 is emitted by the laser module vertically through the top of the protective cage 38 as depicted in FIG. 3. The rotary laser beam 42 is emitted by the laser module horizontally, e.g., at 90° relative to the plumb beam 40. The laser beams 40, 42 may be generated by the laser module in any suitable manner. For example, the laser module may include one or more laser generators, such as a laser diode or an array of laser diodes. The laser module may include any of a variety of laser control structures, such as lens, beam splitters, reflectors, collimators, and the like, so that the laser beams are generated with desired properties.

The head portion 34 is configured to rotate with respect to the support structure about a vertical axis. A drive system (not shown), such as a motor, is attached to the head portion 34 that is configured to cause the head assembly to rotate at one or more predetermined rotational speeds about the vertical axis. The drive system is also configured to cause the head portion and the laser module to rotate to a desired angular position with respect to the axis and to oscillate within a desired angular range about the axis. The drive system may be configured to allow manual positioning of the laser assembly which allows the rotary laser beam to be pointed to a particular point or work surface by the operator. In one embodiment, the laser assembly includes a locking mechanism that is configured to hold the laser assembly in place when the base unit is turned off or put in a standby mode.

Figure 7:
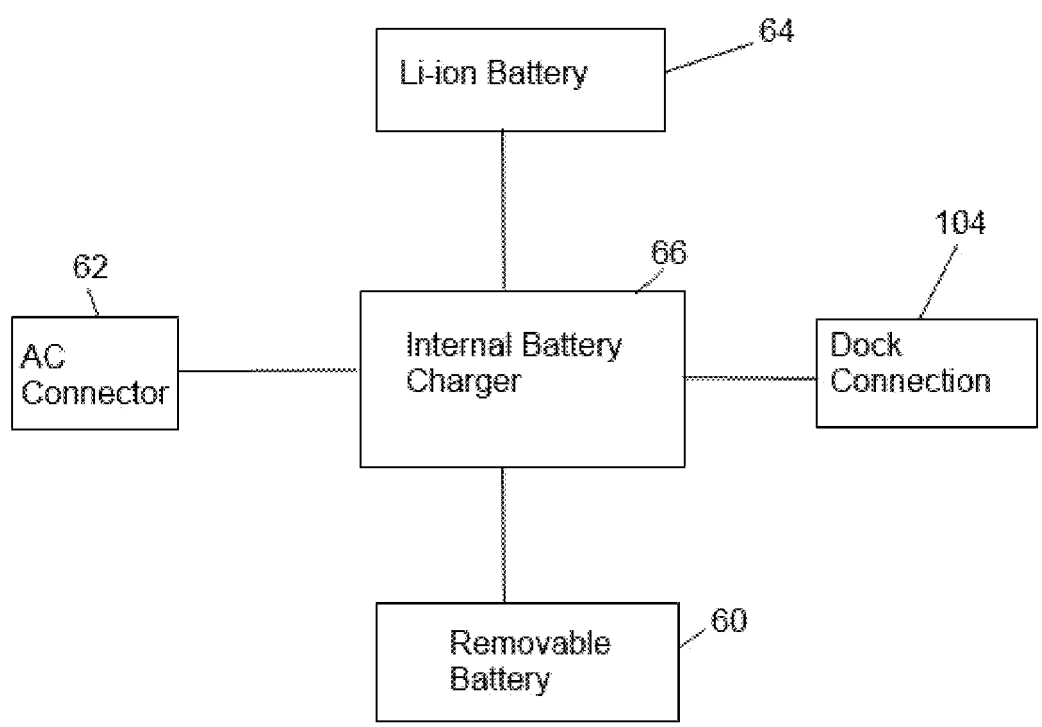
FIG. 7 depicts a block diagram of the power system of the base unit.

Referring to FIG. 7, the power system 52 for the base unit 12 is configured to run on battery power 60. Batteries for the base unit 12 may have a nominal voltage, e.g., between 4 V and 50 V and may include cells having a chemistry of, for example, NiCd, NiMH, Li-ion, etc. A battery tray or battery access panel (not shown) is provided in one of the surfaces of the housing 12 to enable batteries to be installed and removed from the base unit 12. In one embodiment, the base unit 12 is configured to utilize 12V batteries. The base unit 12 may include electrical connections 62 for connecting the base unit 12 to an external power sources, such as an AC outlet, via a power cord. As depicted in FIG. 7, the power system 52 for the base unit 12 includes an internal, rechargeable battery 64 for powering the systems of the base unit 12. The internal battery 64 may comprise a Li-ion battery. The base unit 12 is equipped with an internal battery charger 66 for charging the rechargeable battery 64. The internal battery charger is configured to utilize power from the 12V battery 60 or from the external power source via connection 62 to charge the internal Li-ion battery 64.

Referring again to FIG. 6, the control system 56 includes a controller 68 and electronic storage, or memory 70. The controller 68 comprises a processing device, such as a central processing unit (CPU), an application specific integrated circuit (ASIC), a field programmable gate array (FPGA) device, or a microcontroller. The controller 68 is configured to execute programmed instructions that are stored in the electronic storage 70 for controlling and operating the laser assembly. A real-time clock 57 for the control system 56 is implemented on a chip and has a separate battery, such as a Li-ion battery.

Figure 8:
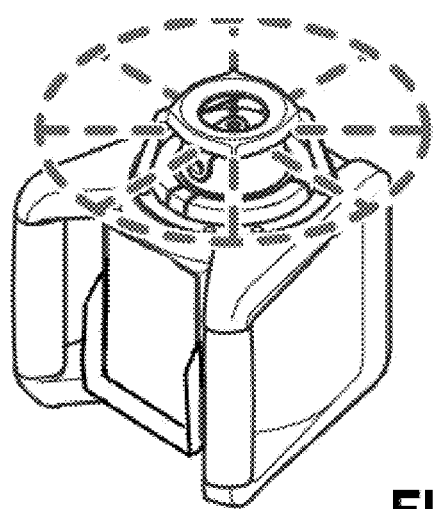
FIG. 8 depicts the base unit during a rotational mode of operation.
Figure 9:
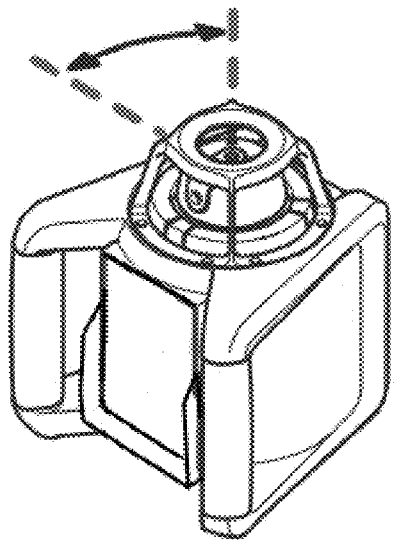
FIG. 9 depicts the base unit during a line mode of operation.
Figure 10:
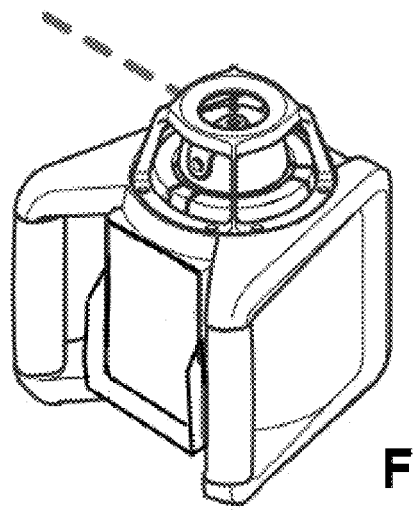
FIG. 10 depicts the base unit during a point mode of operation.

The controller 68 is configured to communicate with the receiver unit 14 via the communication system 54. In one embodiment, the communication system 54 comprises a radio frequency (RF) remote control system having a RF transceiver for transmitting and receiving RF signals. The control system 56 is configured to receive control signals from the receiver unit 14 via the communication system 54 and to execute commands indicated by the control signals. The control signals from the receiver 14 may be used to control the operating mode, aperture angle (for line mode), point angle (for point mode), power (ON/OFF), rotation speed, and the like of the laser assembly. The operating modes include, for example, a rotation mode (FIG. 8), a line mode (FIG. 9), and a point mode (FIG. 10). In rotation mode, the rotary laser beam is moved at a constant rotation speed around the axis of rotation and generates a continuous laser marking on a target surface. In line mode, the rotary laser beam is oscillated back and forth within a limited aperture angle to generate a line-shaped laser mark on a target surface. In point mode, the rotary laser beam is held stationary at a predetermined angular position to generate a point-shaped laser mark on a target surface. The control system 56 may also be configured to transmit battery status information and leveling status information to the receiver unit 14 periodically or in response to requests received from the receiver unit 14.

Figure 11A:
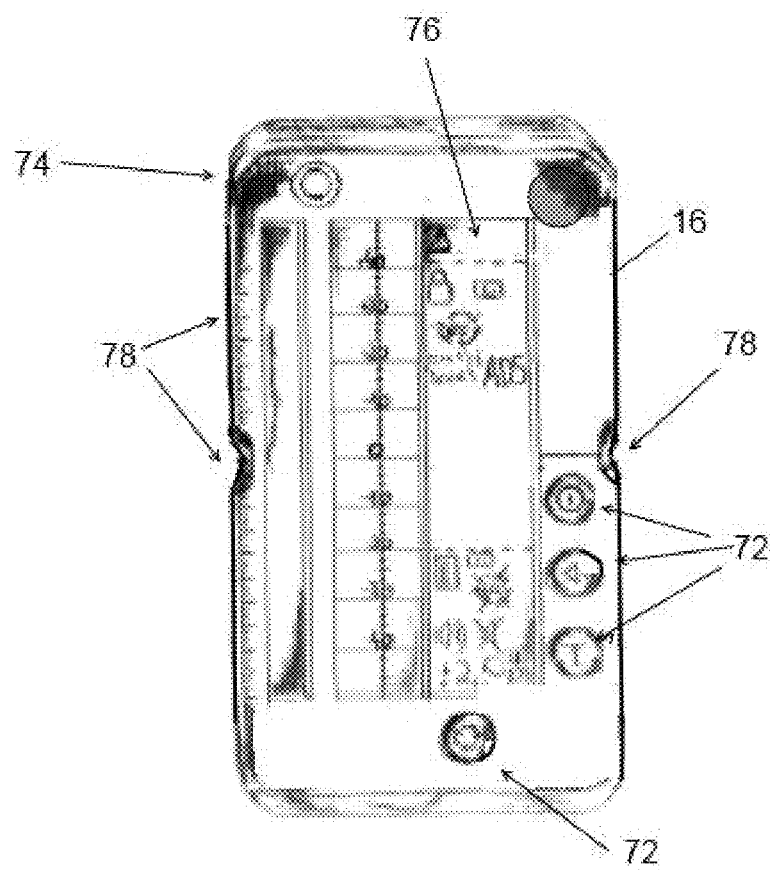
FIG. 11A depicts an embodiment of the receiver unit of FIG. 1.
Figure 11B:
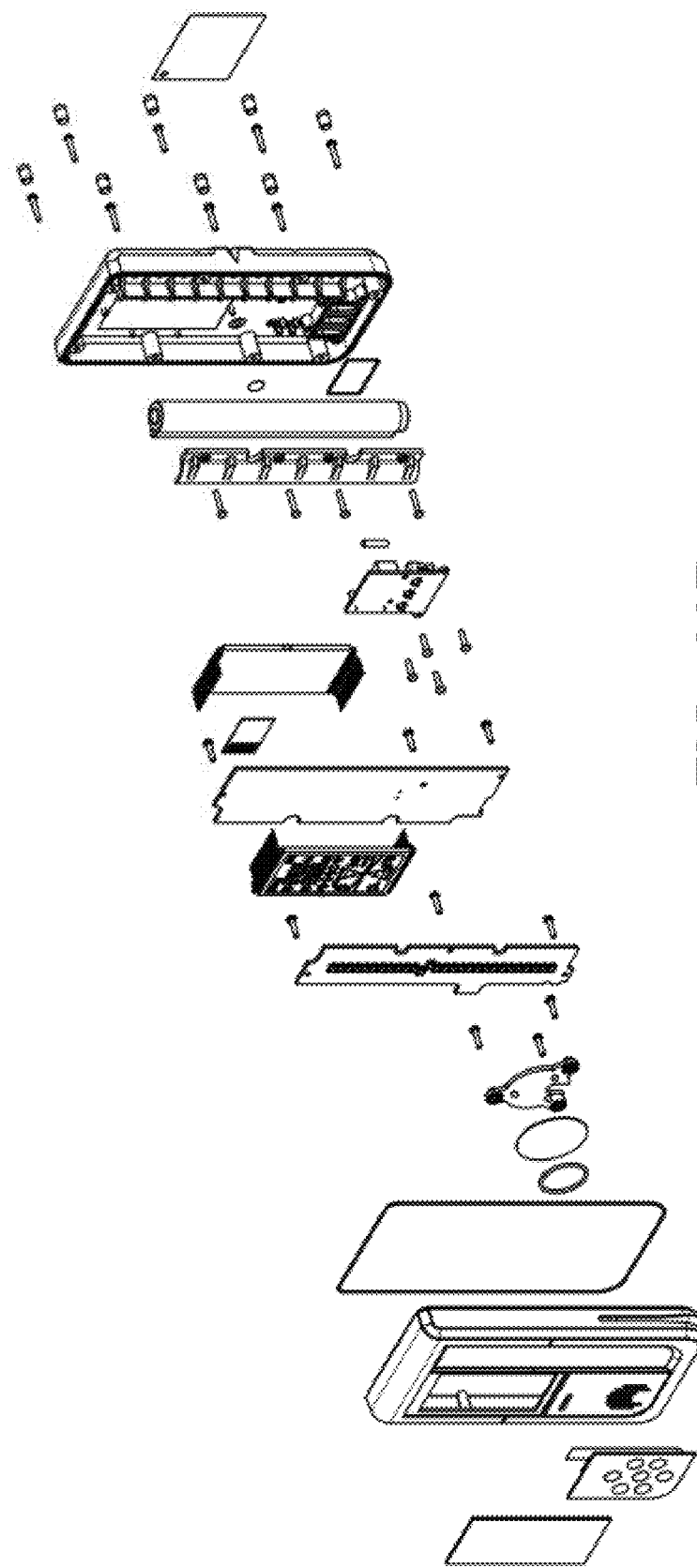
FIG. 11B depicts a first exploded view of the receiver unit of FIG. 11A.

Referring to FIGS. 11A-11C, the receiver unit 14 for the rotary laser level comprises a small, portable housing 16 that is configured to be received and retained in the docking position 44 of the base unit 12. The housing 16 includes control elements 72, a speaker 74, one or more display screens 76, and various gages and markings 78. The housing 16 also includes docking features (not shown), such as rail and groove docking guides, that enable the housing 16 to be removably retained in the docking position 44. The receiver unit 14 also includes one or more magnets (not shown) built into the housing 16 that are configured to enable the receiver unit 14 to be magnetically attached to metal surfaces, such as suspended ceiling installations.

Figure 12:
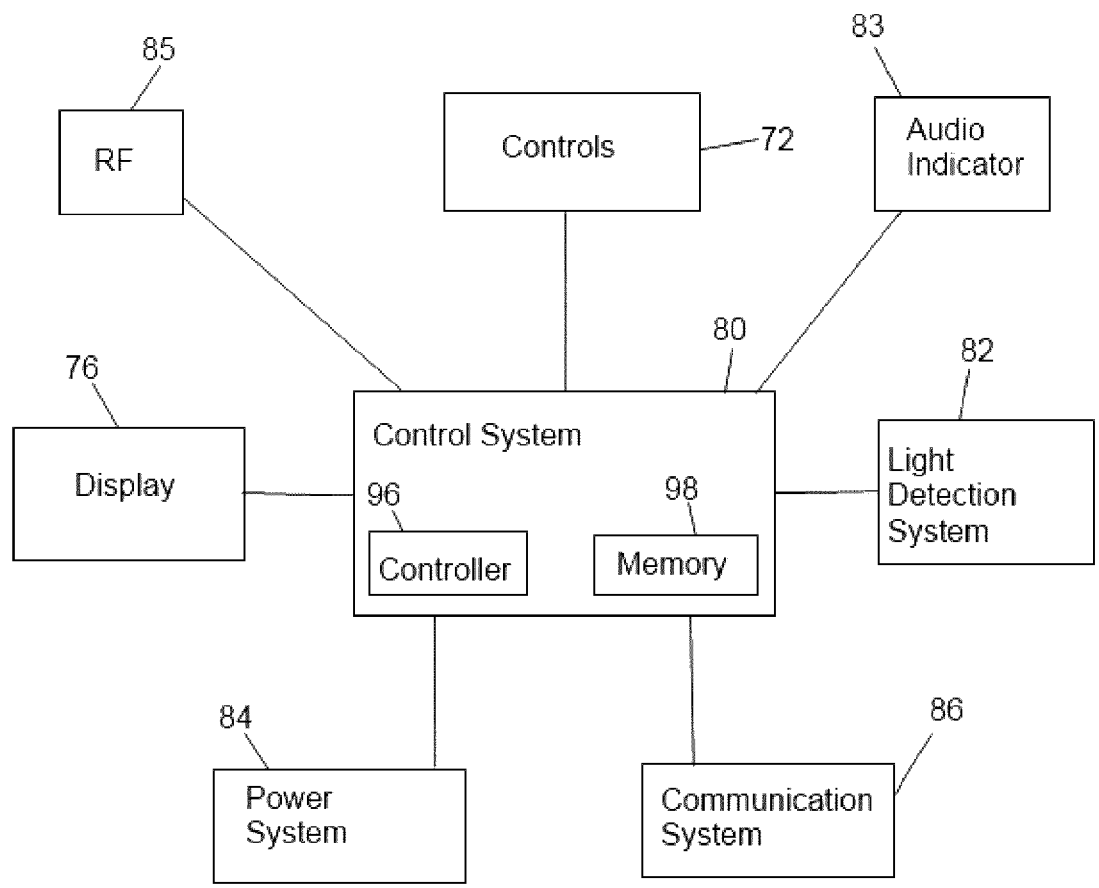
FIG. 12 depicts a block diagram of the components of the receiver unit.
Figure 13:
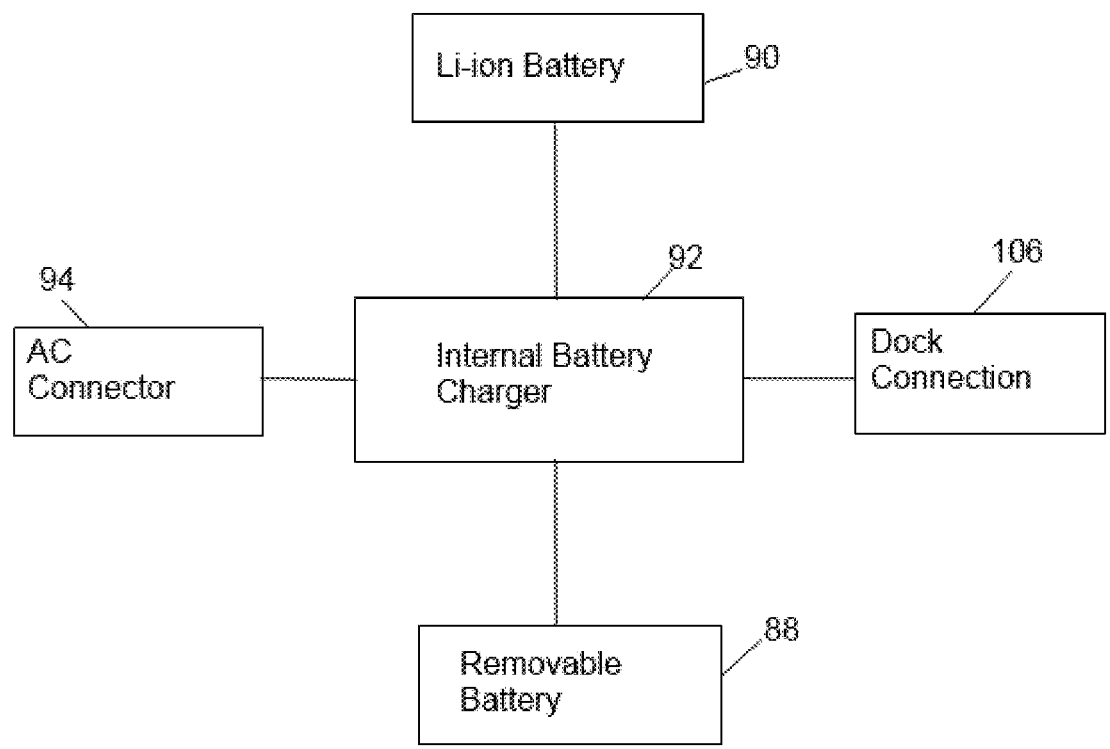
FIG. 13 depicts a block diagram of the power system of the receiver unit.

Referring to FIG. 12, the receiver unit 14 includes a control system 80, a rotational laser detection system 82, an audio indicator 83, a power system 84, an radio frequency (RF) transceiver 85 and a communication system 86 that are supported by the housing 16. As depicted in FIG. 13, the power system 84 is configured to be powered by batteries 88 that are removably received in a battery bay (not shown) provided in the housing 16. Any suitable type and size of batteries may be used. The receiver unit 14 also includes an internal rechargeable battery 90, such as a Li-ion battery. The receiver unit 14 is equipped with an internal battery charger 92 for charging the rechargeable battery. The internal battery charger 92 is configured to utilize power from the removable batteries 88 to charge the internal Li-ion battery. An AC adapter connection 94 may also be provided for charging the internal battery 90.

Referring again to FIG. 12, the control system 80 for the receiver unit 14 includes a controller 96 and electronic storage 98. The controller 96 comprises a processing device, such as a central processing unit (CPU), an application specific integrated circuit (ASIC), a field programmable gate array (FPGA) device, or a microcontroller. The controller 96 is configured to execute programmed instructions that are stored in the electronic storage 98 for controlling and the receiver unit 14 and the base unit 12. The controller 96 is configured to send and receive control signals to the base unit 12 via the communication system 86. In one embodiment, the communication system 86 comprises a remote control system configured to generate control signals for the base unit that are transmitted via the RF transceiver 85.

The rotation laser detection system 82 includes light sensors (not shown) that are configured to receive and detect the laser beams 40, 42 emitted by the base unit 12. The light sensors may comprise any suitable type of light sensor, such as charge coupled devices (CCDs), photodiodes, and the like, that are capable of detecting the laser beams emitted by the laser assembly of the base unit 12. The audio indicator 83 may be activated in response to the detection of the laser beams. The control system 80 may also be configured to determine various information in response to detecting a laser beam, such as beam centers, horizontal reference positions, vertical reference positions, and distances from the base unit 12.

The control system 80 is operably coupled to receive input from the control elements 72 on the housing. The control elements 72 may comprise pushbuttons, knobs, slides, and other types of switches that are configured to allow an operator to control the base unit 12 including the selection of the operating parameters of the laser assembly. For example, the control elements 72 may include control elements for controlling power to the receiver unit 14 and base unit 12 and for selecting the operating mode, scan angle, and rotation speed of the laser assembly.

The control system 80 is configured to cause the display screen 76 to display status indicators, measurements, and other data regarding the operation of the rotary laser level assembly. For example, the control system may be configured to cause the display to indicate the current operating mode, rotation speed, scan angle, distance and position measurements, battery status, and the like. The display screen 76 may comprise any suitable type of display, such as a liquid crystal display (LCD). In one embodiment, the receiver unit 14 includes a display screen 76 on both sides of the receiver 14 to allow easy viewing of status indicators, measurements, and other data.

Docking

As discussed above, the receiver unit 14 is configured to be docked to the docking position of the base unit 12. Complementary docking features on the receiver unit 14 and the base unit 12 cooperate to enable the receiver unit 14 to be removably retained on the base unit 12. The receiver unit 14 can be docked to the base unit 12 when not in use to facilitate transportation and storage of the rotary laser level assembly. As can be seen in FIG. 1, the carrying handles 48 project forwardly beyond the receiver unit 14 which allows the carrying handles 48 to shield and protect the receiver unit 14 from impacts and falls when docked to the base unit 12.

The base unit 12 is configured to detect when the receiver unit 14 is docked to the docking position of the base unit 12. In one embodiment, the base unit 12 is equipped with a magnetic reed switch 102 (FIG. 6) that is implemented on docking board PCB 55 (separate PCB from the control system PCB A) which is mounted to the inner wall of the base housing for detecting the presence of the magnets of the receiver unit 14 in the docking position. Alternatively, the base unit 12 may include other types of sensors, such as magnet sensors, light sensors, proximity sensors, capacitive sensors, and the like, that are configured to detect various conditions indicative of the receiver unit 14 being docked to the base unit 12.

Referring to FIGS. 7 and 13, the power system 52 for the base unit 12 may include electrical connections 104, e.g., charge terminals, located in the docking position 44 for connecting to complementary electrical connections 106 on the receiver unit 14 so that, when the receiver unit 14 is docked to the base unit 12, the receiver unit 14 can receive power from the power source 60 of the base unit 12. In this case, the internal battery charger 92 for the receiver unit 14 is configured to utilize power via the base unit 12 to charge the internal Li-ion battery 90. In turn, the base unit is powered by the adaptor. This allows for simultaneous charging of the base unit 12 and receiver unit 14 when the receiver unit 14 is docked. The control system 56 of the base unit 12 may be configured to control power to the electrical connection 52 in order to remove power from the electrical connection 52 when the dock sensors 102 indicate the receiver unit 14 is not docked. The electrical connections 104 of the base unit 12 may be sealed to prevent water ingress and to achieve a desired ingress protection (IP) rating. In one embodiment, the charge terminals of the base unit 12 are sealed by o-ring seals. The o-ring seals are positioned against the printed circuit board assembly (PCB A) onto which the charge terminals are soldered.

The receiver unit 14 and base unit 12 are configured to be paired together to enable two-way communication and control of the base unit 12 by the receiver unit 14. In one embodiment, device pairing is performed when docking occurs. For example, when the dock sensor 102 indicates that a receiver unit 14 is docked to the base unit 12, the control system 80 of the base unit 12 transmits a unique identifier, such as an address, ID number, serial number, and the like, (previously assigned to the base unit 12) to the receiver unit 14. The receiver unit 14 can then use this unique identifier to communicate with the base unit 12. Multiple receiving units 14 may be paired with the base unit in this manner so that multiple receiver units can be used to operate the same base unit 12. Pairing the base unit 12 with one or more receiver units enables more than one base unit 12 to be operated in an area without the receiver units for one base unit 12 interfering with the operation of other base units. In an alternative embodiment, the base unit 12 may be configured to be paired with a single receiving unit 14 or a set number of receiving units 14 at a time. An option to pair the base unit 12 with multiple receiving units 14 or a single receiving unit 14 may be provided as a user selectable item in the control system.

Theft Prevention and Detection Features

The rotary laser level assembly includes theft prevention and detection features in order to reduce the possibility of theft of the base unit 12. A first theft prevention feature is provided by the fact that no switches or displays are incorporated into the base unit 12. All of the controls and displays for operating the rotary laser level assembly are incorporated into the receiver unit 14. When the receiver unit 14 is not docked, it is obvious from the lack of a user interface and the empty docking position that the product is incomplete. This is a passive theft prevention feature.

Figure 14A:
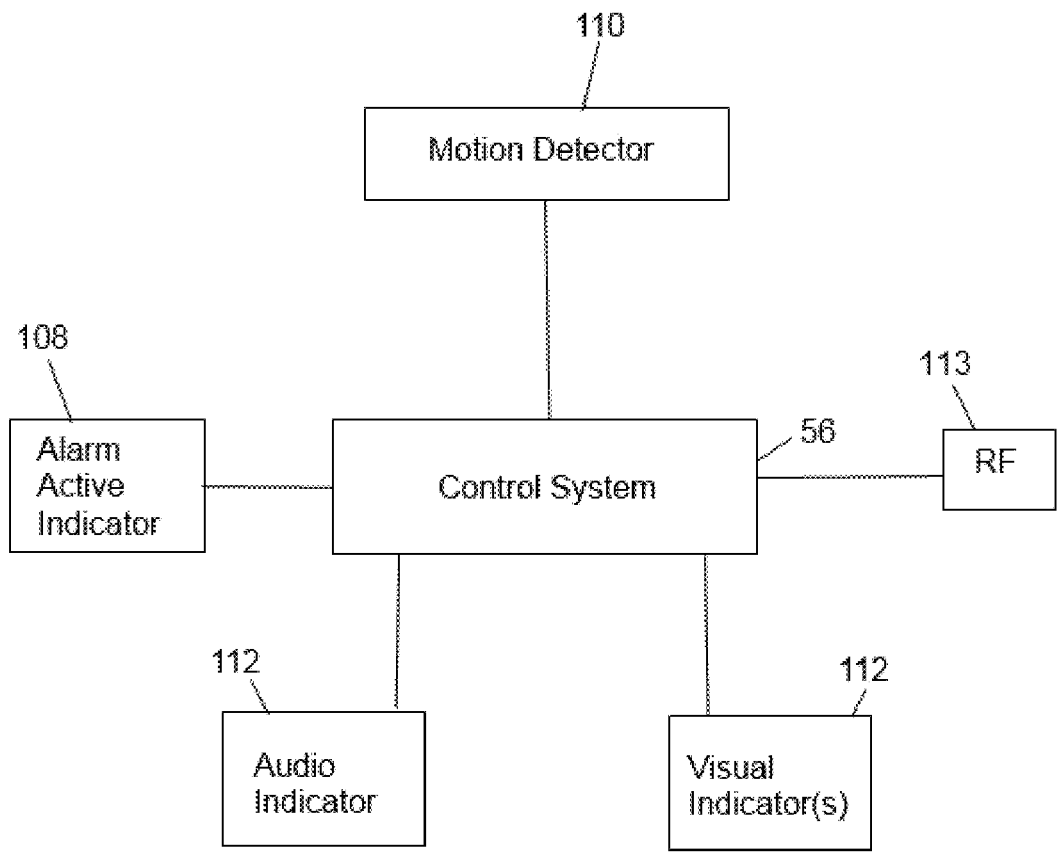
FIG. 14A depicts a block diagram of the theft prevention and detection system of the base unit.

The base unit 12 also includes a second theft prevention feature for active theft prevention. The second theft prevention feature comprises a theft detection and deterrence system incorporated into the base unit 12 that can be activated and deactivated by the receiver unit 14. Referring to FIG. 14A, the theft detection and deterrence system includes an alarm active indicator 108, a theft detector 110, a RF transceiver 113, and theft indicators 110. The alarm active indicator 108 comprises a visual indicator, such as a flashing LED light, provided on the base unit 12. The alarm active indicator 108 is actuated when the base unit 12 is powered on, or in a standby mode, to indicate that an alarm is active (which may also indicate that the base unit 12 is operational so an operator may be nearby) to serve as a theft deterrent.

The theft detector 110 comprises a motion sensor, such as a MEMS accelerometer, incorporated into the base unit 12 to detect when the base unit 12 is being moved. The motion sensor is configured to output X, Y, and Z acceleration values for indicating movement in three-dimensions. Using movement for theft detection is based on the fact that the base unit 12 must be stationary when operational. When movement of the base unit 12 is detected, one or more theft indicators 112 may be actuated. In one embodiment, the control system 56 may be configured to activate the theft indicators 112 only after movement of a predefined duration has been detected so that alarms are not activated in response to an innocent situation, such as the base unit 12 being jostled by wind or someone or something inadvertently bumping into the base unit 12 causing the base unit 12 to move slightly.

The theft indicators 112 may comprise audio and/or visual indicators that are used to draw attention to the area and alert nearby personnel that a theft is occurring. For example, in one embodiment, the base unit 12 includes a speaker system for generating an alarm sound, such as loud buzzing, sirens, beeps, or combinations of different sounds. One or more visual indicators, such as LEDs, may be illuminated and/or flashed to indicate theft. In one embodiment, the alarm active indicator 108, which otherwise generates a constant, cool and/or slowly blinking light may be made brighter and/or flashed more rapidly to indicate theft. The receiver unit 14 can be used to deactivate the theft indicators 112 by communicating a deactivation signal from the RF transceiver 85 of the receiver to the RF transceiver 113 of the theft deterrence system.

Figure 14B:
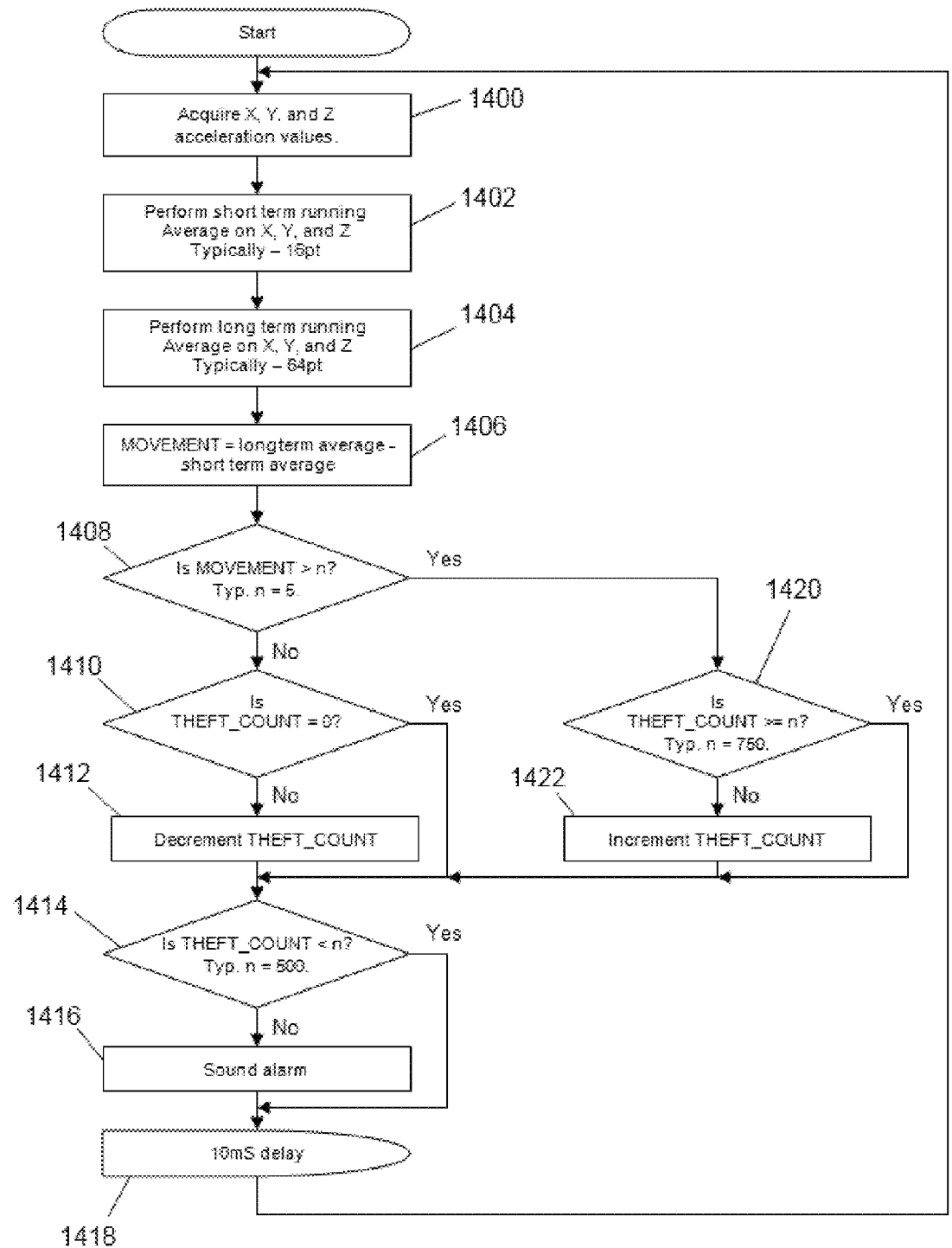
FIG. 14B depicts a flowchart of a process used by the control system to detect theft using motion sensor output.

Referring to FIG. 14B, a flowchart of a process of monitoring the output of the motion sensor 110 to determine whether or not an alarm should be generated. At block 1400, the X, Y, and Z acceleration values from output of the motion sensor 110 are acquired. The control system 56 is configured to maintain a short term running average of the X, Y, and Z values, e.g., a 16 pt running average (block 1402). The control system 56 is also configured to maintain a long term running average of the X, Y, and Z values, e.g., a 64 pt running average (block 1404). The control system 56 is configured to calculate a MOVEMENT value which corresponds to the long term average minus the short term average (block 1406).

At block 1408, the MOVEMENT value is compared to a threshold value n that has been determined to be indicative of movement of the base unit. In the embodiment of FIG. 14B, the threshold value n for movement is 5. The control system is configured to maintain a running count, referred to as THEFT_COUNT in FIG. 14B, that is incremented each cycle that movement is detected (i.e., MOVEMENT>n) and decremented each cycle that movement is not detected (i.e., MOVEMENT<n). According to the flowchart, if MOVEMENT<n, movement is not detected and control proceeds to block 1410. At block 1410, it is determined whether or not THEFT_COUNT is equal to 0. If THEFT_COUNT is not equal to 0, then THEFT_COUNT is decremented at block 1412. If THEFT_COUNT is equal to 0, then block 1412 is bypassed so that THEFT_COUNT is not decremented. Therefore, THEFT_COUNT should never be less than 0.

At block 1414, THEFT_COUNT is compared to a lower limit threshold value for duration of movement of the base unit that may indicate theft. In the embodiment of FIG. 14B, the lower limit threshold value is selected to be 500. If THEFT_COUNT is greater than 500, then theft may be indicated and an alarm is generated at block 1416. If THEFT_COUNT is less than the lower limit threshold (n=500), then block 1416 is bypassed. At block 1418, there is a delay (e.g., 10 mS) before returning to block 400 to perform another cycle.

At block 1408, if MOVEMENT is greater than n, control proceeds to block 1420 and THEFT_COUNT is compared to an upper limit threshold value (e.g., n=750). If THEFT_COUNT is less than 750, THEFT_COUNT is incremented at block 1422. If THEFT_COUNT is greater than or equal to 750, control bypasses block 1422 so that THEFT_COUNT is not incremented. In either case, control proceeds to block 1414 where THEFT_COUNT is compared to the lower limit threshold value (e.g., n=500).

Calibration Reminders

The base unit 12 may require periodic servicing to calibrate the laser assembly so as to maintain the precise horizontal and vertical orientations of the rotary and plumb laser beams. Scheduling the servicing or reminding the operator to check the calibration is typically the responsibility of the owner/operator of the tool. The rotary laser level assembly includes an integrated electronic calibration reminder system that is configured to remind the operator of the need to periodically check the calibration of the base unit 12 and to have the base unit 12 serviced at regular intervals.

The reminder system is configured to generate service reminders and calibration reminders. The service reminders are timed reminders for indicating when servicing needs to be performed. There are two types of timed service reminders, one type of service reminder is based on predefined intervals and another type of service reminder based on hours of operation. The predefined service intervals and hours of operation limits may be based on factory specifications and programmed into the electronic storage 70 of the control system 56 of the base unit 12. The control system 56 of the base unit 12 is configured to monitor elapsed time between servicing as well as hours of operation, i.e., run time, and to generate a service reminders to indicate when a predefined service interval or hours of operation limit has expired.

Calibration reminders are generated in response to operating conditions and events that can alter the calibration of the base unit 12. For example, the base unit 12 is configured to be operated within predefined, factory-specified temperature and humidity limits. Temperature and humidity limits may be specified for storage as well as operation of the base unit 12 may be specified. Operating or storing the base unit 12 in temperature and humidity conditions outside of these limits can adversely impact the calibration of the system. Calibration can also be altered by shocks to the base unit 12 that may result from drops, falls, and impacts.

Figure 6:
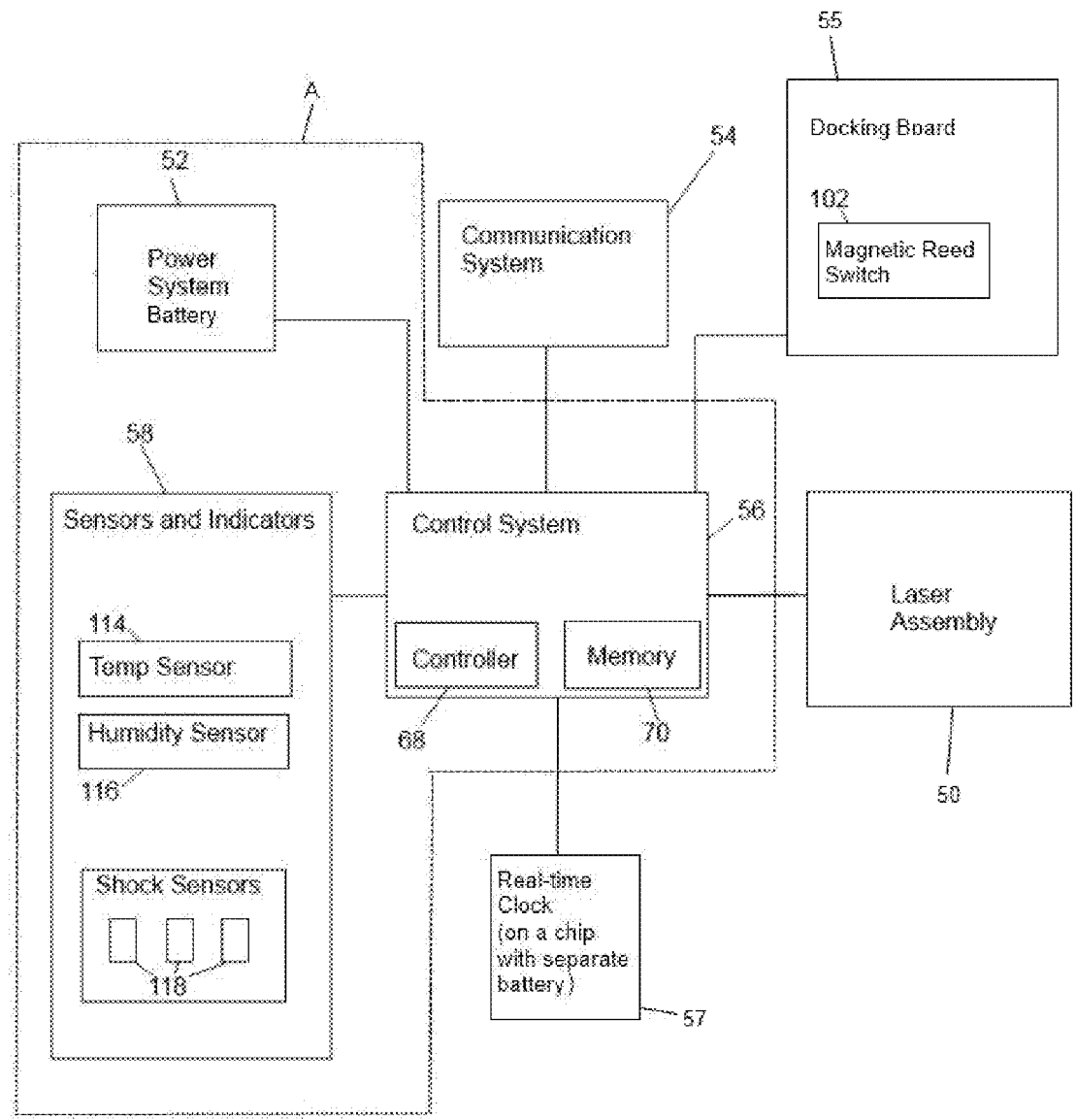
FIG. 6 depicts a block diagram of the components of the base unit.

Referring to FIG. 6, the base unit 12 includes sensors 114, 116, 118 for detecting environmental conditions as well as shocks and impacts to the base unit 12 that can alter calibration so that calibration reminders can be generated to indicate that the calibration of the base unit 12 should be checked. The sensors include temperature and humidity sensors 114, 116 for detecting the temperature and humidity of the environment in and around the base unit 12. When the base unit 12 is powered off, the control system 56 for the base unit 12 is configured to wake the electronics of the system at predefined intervals in order to activate the temperature and humidity sensor to measure the temperature and humidity.

The control system 56 is configured to compare the detected temperature and humidity to the storage limits for temperature and humidity. If either of these values exceeds the storage specifications for the base unit 12, the incident is logged and a calibration reminder is given next time the unit is powered on. When the base unit 12 is powered on, or in standby mode, the control system is configured to generate a calibration reminder immediately when the sensors 114, 116 indicates that the operating specifications for temperature and/or humidity have been exceeded.

The shock sensors 118 for the base unit 12 comprise three piezo sensors arranged at right angles with respect to each other to detect shock in all three spacial planes. The sensitivity of the piezo sensors and associated electronics are set so as to trigger when the unit experiences a shock large enough to possibly alter the calibration. Detection of shocks is possible when the base unit 12 is powered on, in standby, or powered off. If the base unit 12 is powered on, or in standby, the control system 56 is configured to generate a calibration reminder immediately when the shock sensors are triggered. When the device is powered off, the piezo sensors generate a voltage that wakes the control system 56 to log the shock event. A calibration reminder may then be issued the next time the base unit 12 is powered on.

Because the base unit 12 does not have a display, any service and calibration reminders are communicated to the receiver unit 14. The receiver unit 14 includes one or more reminder indicators for indicating the reminders. Reminder indicators may comprise icons that can be displayed on the display screen of the receiver unit 14. Multiple indicators or icons may be used to indicate the type of reminder and what triggered the reminder. For example, a main reminder indicator may be displayed to indicate that service is required or calibration should be checked. Additional indicators may be displayed to indicate whether the reminders are based on shock, temperature, humidity or time. In addition to providing the user with service and calibration reminders, the control system of the base unit 12 logs all the service and calibration reminder events in memory 70. The log can be accessed during servicing and repair of the base unit 12 to help in fault diagnosis and future product development.

Partially Automated Calibration

As mentioned above, calibration reminders may be generated in response to operating conditions or shocks to the base unit 12 being detected that can alter the calibration of the base unit 12. The present disclosure proposes a method for partially automating the calibration process of the level position of the base unit 12. The method leverages the two-way RF communication built into the base unit 12 and receiver unit using the receiver unit 14 to detect the position of the laser beam and allowing the base unit to automatically adjust level position to the receiver unit 14.

Figure 15:
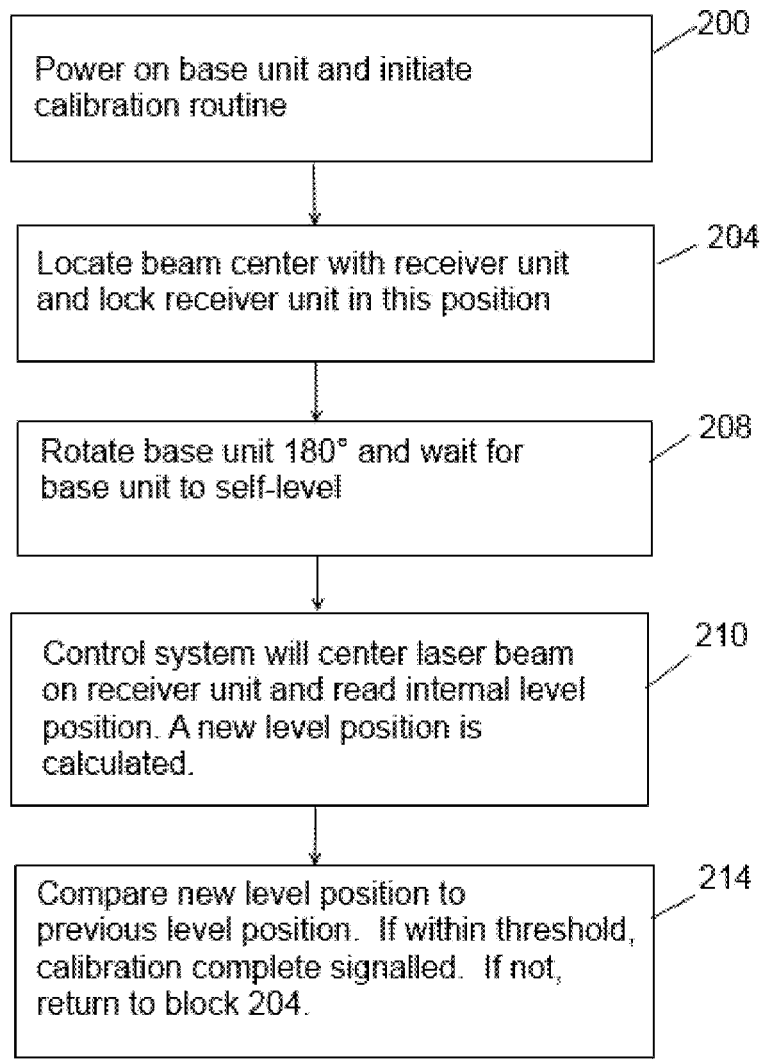
FIG. 15 depicts a flowchart of a partially automated process for calibrating the rotary laser level system of FIG. 1.

Referring to FIG. 15, the method begins with powering on the base unit 12 and initiating a calibration routine through the receiver unit 14 (block 200). When the base unit 12 is powered up, the laser assembly of the base unit 12 automatically levels itself (block 204). Once the laser assembly has initially leveled, the receiver unit 14 is used to locate the center of the laser beam 42. The receiver unit 14 is then locked in this position (block 208). For example, the receiver unit 14 can be placed on a support surface or magnetically attached to a metal wall.

The operator then rotates the base unit 12 180° about the axis of rotation and waits for the base unit 12 to self-level (block 210). The base unit 12 will then center the laser beam 42 on the receiver unit 14. The control system 56 of the base unit 12 reads the internal level position of the laser assembly and calculates a new level position (block 212). The control system then compares the new level position to the previous level position (block 208). If the control system determines that the new level position is within a predefined limit from the previous level position, then the control system 56 can signal the receiver unit 14 that the calibration procedure is complete (block 214). If the new level position is outside of the predefined limit, the control system stores the current level position as the initial level position and performs the calibration process again.

Laser Position Detection

In one embodiment, the rotational laser system 82 of the receiver unit 14 has a configurable bandwidth for controlling the distance over which the system 82 is capable of detecting the beam center. With most previously known laser receivers the bandwidth varies with distance. For example, higher bandwidths typically allow the beam center to be detected over larger distances but the accuracy of the measurement is decreased while lower bandwidths typically allow greater accuracy but decrease the distance over which the beam center can be detected. The absolute bandwidth values are specified at a specific distance as the laser beam diverges with distance. The present disclosure proposes a sensor system design capable of decreasing the variation of the bandwidth with distance so that the light detection system has a flatter overall detection bandwidth. This will enable greater accuracy at longer distances than previously known detection systems for receiver units.

In accordance with one embodiment, a method of detecting a laser beam emitted by a rotary laser tool includes receiving light via an optical window of the receiver unit, and directing the light received via the optical window onto a first light sensor array and a second light sensor array. At least one signal is output from the first light sensor array indicating a characteristic of the light incident upon the first light sensor array. At least one signal is output from the second light sensor array indicating a characteristic of the light incident upon the second light sensor array. The at least one signal from the first light sensor array and the at least one signal from the second light sensor array are processed with respect to each other to produce a measurement signal. A determination is then made whether the received light is a laser beam emitted by the laser tool based on the measurement signal.

In another embodiment, a laser receiving unit configured to laser detection includes a portable housing having an optical window configured to allow light to pass into the housing. A laser light sensor assembly is mounted within the housing that includes a first light sensor array and a second light sensor array. At least one linear multiple stage amplifier is coupled to receive an output of the first light sensor array and to produce a plurality of amplified first signals from the output of the first light sensor with substantially linear gain. At least one linear multiple stage amplifier is coupled to receive an output of the second light sensor array and to produce a plurality of amplified second signals from the output of the second light sensor with substantially linear gain. A control system is coupled to receive each of the amplified first signals and each of the amplified second signals and configured to process the amplified signals to determine whether light incident upon the first light sensor array and the second light sensor array is from a laser beam emitted by the laser tool.

Figure 16:
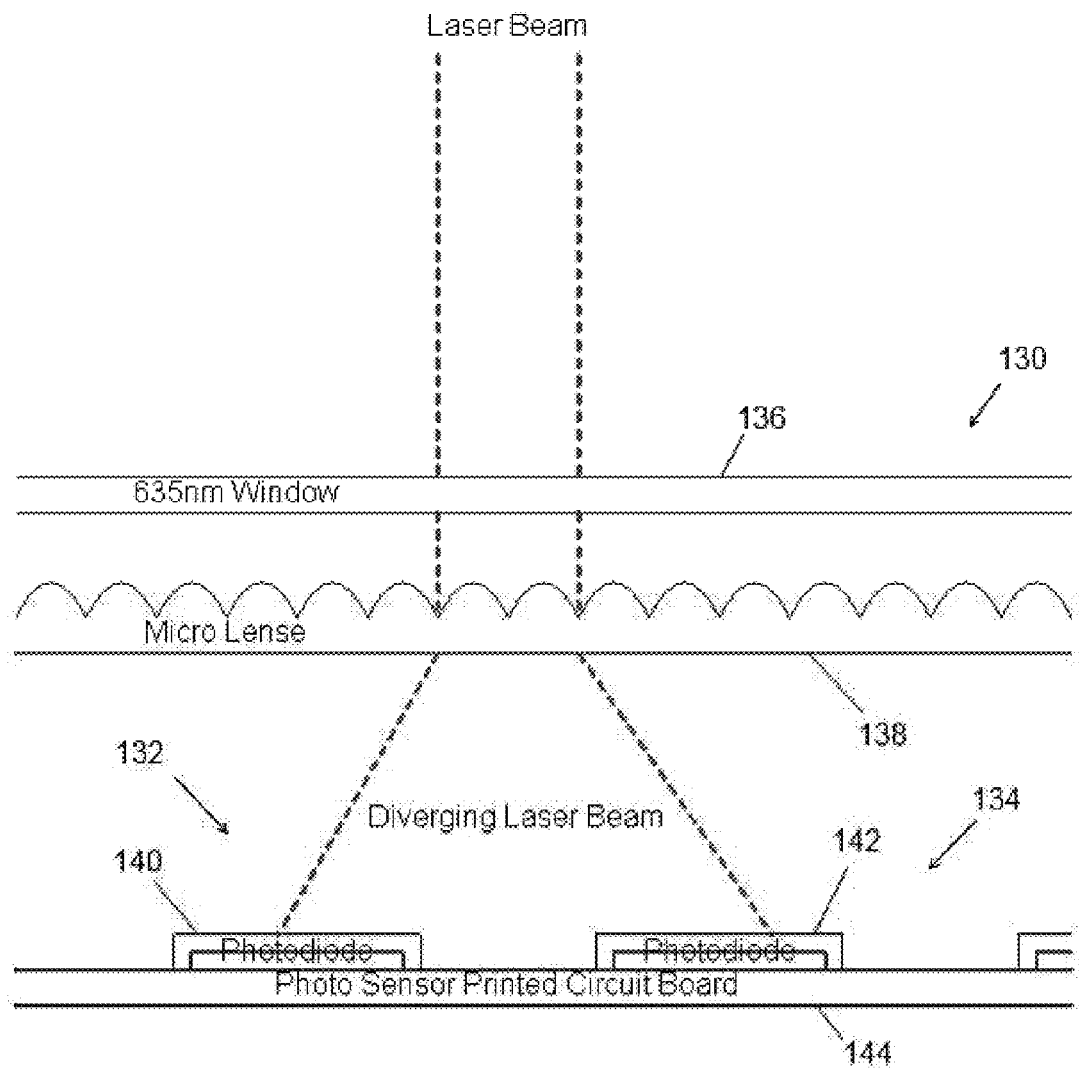
FIG. 16 depicts a circuit diagram of the light detection system of the receiver unit.

Referring to FIG. 16, a rotational laser detection system 130 includes two light sensors 132, 134 which may be built from discrete components. On the optical side, the detection system 130 comprises an optic filter window 136, a micro lens 138, and photodiode arrays 140, 142 mounted on a printed circuit board 144. The optical filter window 136 is configured to block unwanted light. The micro lens 138 is configured to spray the light over the adjacent photodiodes 140, 142 of the detectors 132, 134. The photodiode arrays 140, 142 are configured to convert the received light into a proportional current. Based the sensor information from each sensor array, overall characteristics of the light incident on the sensor arrays may be determined. Because the light sensor is split into two parts, detection of the center point of the beam is more accurate. This also provides a technique for strobe detection and rejection.

Figure 17:
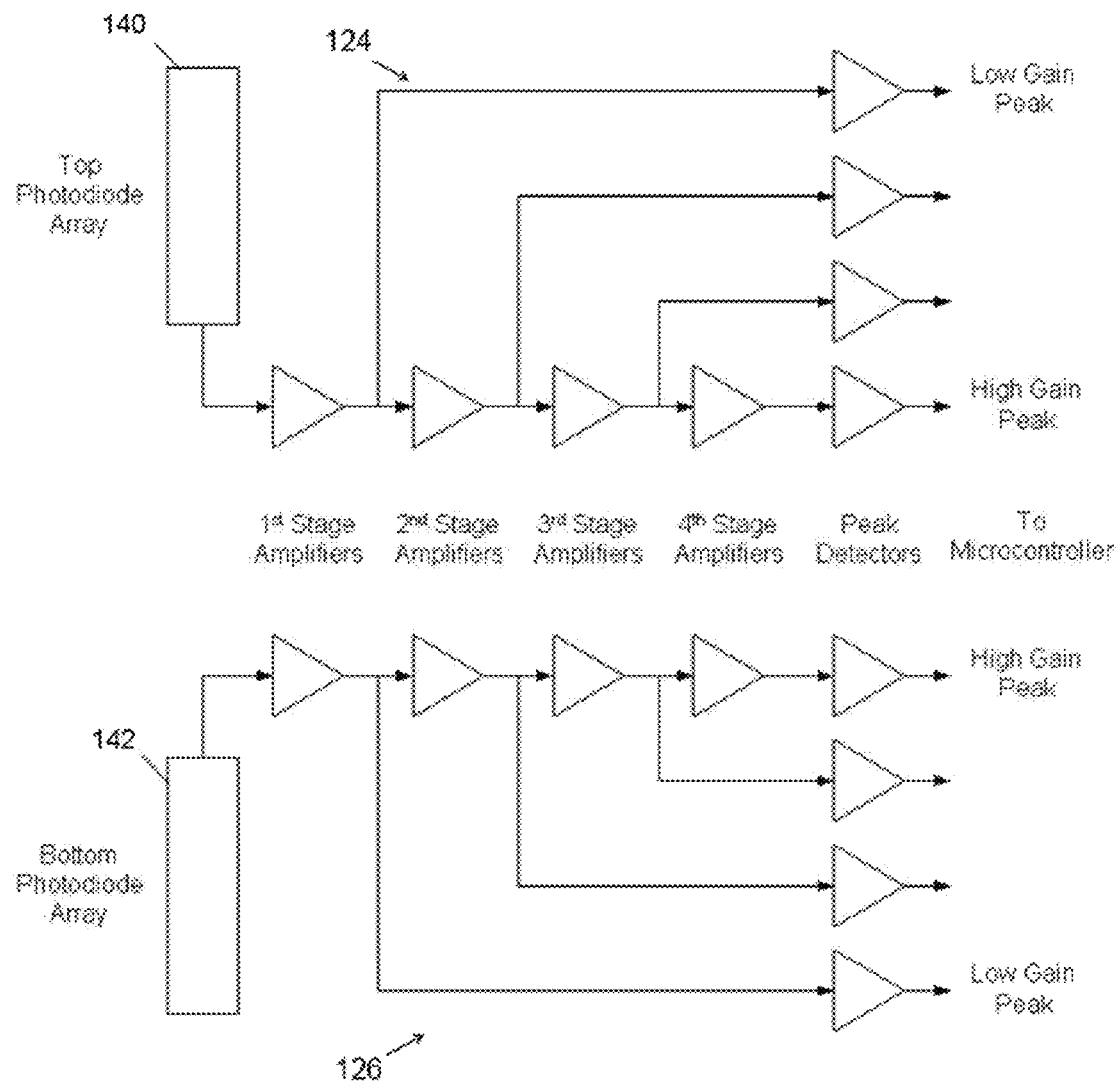
FIG. 17 depicts a schematic illustration of the rotational light position sensor.

FIG. 17 depicts one embodiment of a circuit for processing output of the photodiode arrays 140, 142 for laser detection. In the embodiment of FIG. 17, the output of the photodiode array 140 is directed to a first linear multiple stage amplifier 124, and the output of the output of the photodiode array 142 is directed to a second linear multiple stage amplifier 126. A multiple stage amplifier provides better linearity for amplifying the received signal. In the embodiment of FIG. 17, two four stage amplifiers are utilized although more or fewer stages could be used.

The stages of the amplifiers 124, 126 are configured to provide a substantially linear gain. The amplified signal from each stage of the amplifiers 124, 126 is received by the control system 80, e.g., implemented on the circuit board 144. The control system 80 of the receiver unit 14 is configured to select the amplified signals from the amplifier stage(s) having the best signal, e.g., the highest signal-to-noise ratio, for detecting the laser beam. The amplitude of the selected signal, i.e., the gain, is then used to scale the bandwidth. In this manner, the variation of bandwidth with distance can be reduced so a "flatter" detection bandwidth is provided.

Figure 18:
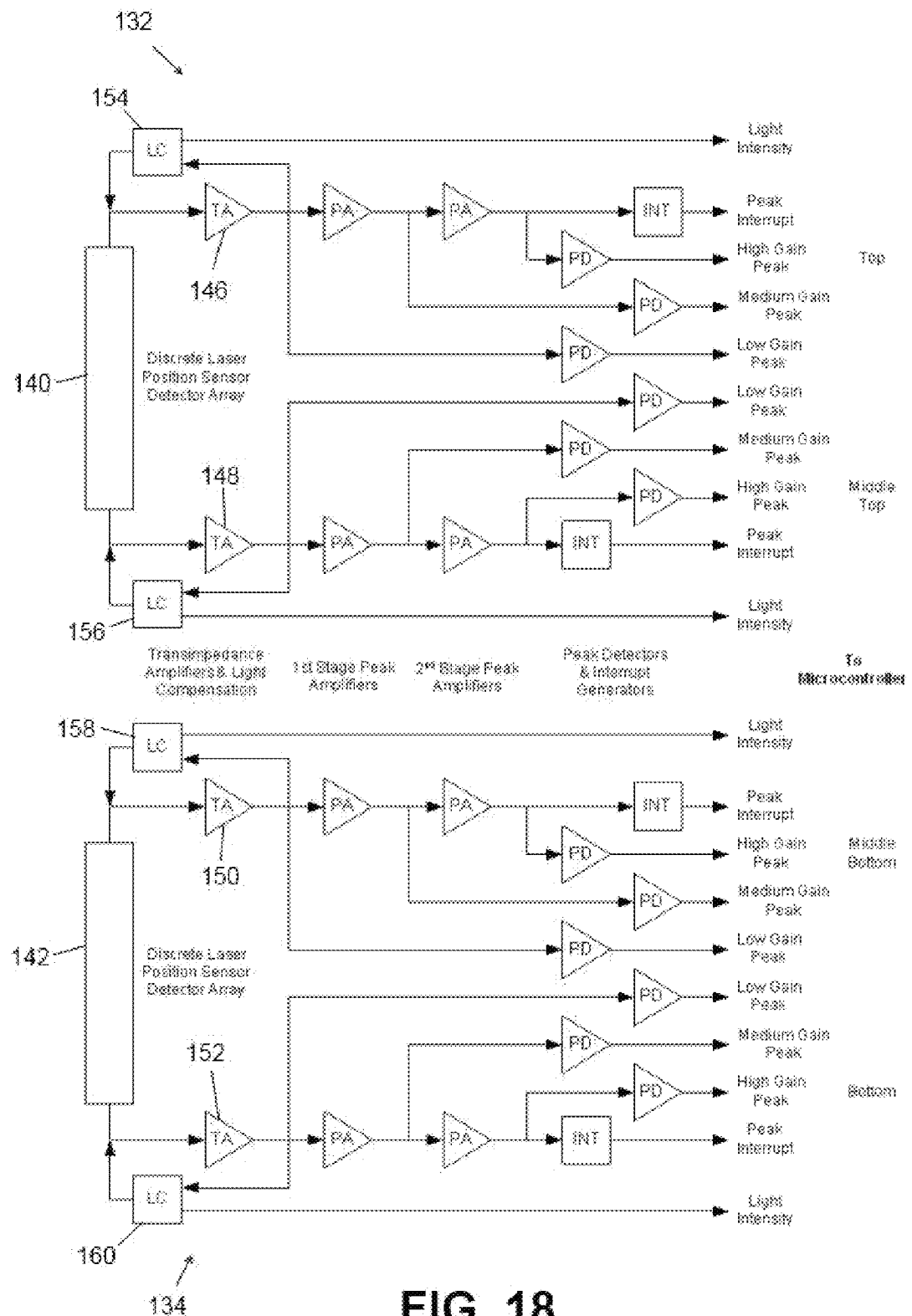
FIG. 18 depicts a block diagram of the rotational light position sensor.

As an alternative to the rotational laser detection system of FIG. 17, the receiver unit may be provided with a rotation laser detection system as depicted in FIG. 18. The rotational laser detector of FIG. 18 is capable of an accuracy within a range of +−0.5 mm over the surface of the laser detector sensor. The rotational laser detector of FIG. 18 includes electronics for actively compensating for sunlight and florescent light falling on the sensors. This electronics also has additional light intensity output signals which can be fed to the micro-controller. By monitoring the sunlight intensity over the surface of the sensor, predictions on its linearity can be made ensuring no erroneous measurements are generated.

Referring to FIG. 18, the two laser position sensor detectors 132, 134 of the laser detection system 130 are built from discrete components. On the optical side the detection system 130 comprises an optic filter window 136, a micro lens 138, and photodiode arrays 140, 142 mounted on a printed circuit board 144. The optical filter window 136 is configured to block unwanted light. The micro lens 138 is configured to spray the light over the adjacent photodiodes 140, 142 of the detectors 132, 134. The photodiode arrays 140, 142 are configured to convert the received light into a proportional current.

Referring to FIG. 18, the currents produced by the photodiodes in the photodiode array 140 are steered by resistors to two transimpedance amplifiers 146, 148, i.e., top transimpedance amplifier (TTA) and middle top transimpedance amplifier (MTTA). The currents produced by photodiodes of photodiode array 142 are steered by resistors to two transimpedance amplifiers 150, 152, i.e., middle bottom transimpedance amplifier (MBTA) and bottom transimpedance amplifier (BTA).

The distribution of photodiodes receiving incident light as well as the intensity of incident light on the photodiodes governs the proportion of current that will be steered to each amplifier. The difference between the amplifier signal outputs will therefore be able to indicate a characteristic of the light incident upon the sensor arrays, such as the portion of the sensor array receiving incident light and/or a position or positions on the sensor receiving incident light.

A light compensator is associated with each transimpedance amplifier. For example, a top light compensator (TLI) 154 is associated with the top transimpedance amplifier 146, a middle top compensator (MTLI) 156 is associated with the middle top transimpedance amplifier 148, a middle bottom light compensator (MBLI) 158 is associated with the middle bottom transimpedance amplifier 150, and a bottom light compensator (BLI) 160 is associated with the bottom transimpedance amplifier 152.

The outputs of the sensor board 144 (FIG. 17) include the outputs of the four transimpedance amplifiers 146, 148, 150, 152 and the outputs of four light compensators 154, 156, 158, 160 all of which are communicated to the control system 80 of the receiver 14. The control system 80 is configured to compare the difference of the four outputs of the transimpedance amplifiers 146, 148, 150, 152 to determine the position of the laser beam on the sensor. If the signal from all the amplifiers is similar, the sensor has been hit by a strobe light. The four light intensity outputs of the light compensators 154, 156, 158, 160 give an indication of the sunlight intensity and distribution over the entire sensor.

Additional electronics is required to interface the sensors output to the analog to digital converters of the controller 96. Firstly, peak detectors PD are used hold the peaks of the detected light pulses. Secondly, peak amplifiers PA are used to further amplify the sensor signals for long range detection, and thirdly, peak interrupt generators INT are used to generate an interrupt to the controller every time a peak is detected. After an interrupt is received the controller 96 will measure the peaks using its integrated analog to digital converters.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of detecting a laser beam emitted by a laser tool, the method comprising:
   receiving light via an optical window of a receiver unit;
   directing the light received via the optical window onto a first light sensor array and a second light sensor array, the first and the second light sensor arrays being arranged adjacent to each other within the housing;
   outputting a first and a second signal from the first light sensor array to a first and a second transimpedance amplifier, respectively, and to a first and second light compensator, respectively, the first and the second signals being indicative of the light incident upon the first light sensor array;
   outputting a third and a fourth signal from the second light sensor array to a third and a fourth transimpedance amplifier, respectively, and to a third and a fourth light compensator, respectively, the third and the fourth signals being indicative of the light incident upon the second light sensor array;
   processing output signals from the first, second, third and fourth transimpedance amplifiers to determine where the light is incident on the first and the second light sensor array; and
   processing output signals from the first, second, third and fourth light compensators to determine an intensity and/or distribution of light on the first and the second light sensor arrays.

2. The method of claim 1, further comprising:
   filtering light such that only light of a predetermined wavelength or range of wavelengths is permitted to pass through the optical window.

3. The method of claim 1, further comprising:
   using a lens to spread light received via the optical window so the light is incident upon both the first and the second sensor array.

4. A laser receiving unit for a laser tool, the laser receiving unit comprising:
   a portable housing;
   an optical window on the portable housing configured to allow light to pass into the housing;
   a laser light sensor assembly mounted within the housing and including:
      a first light sensor array;
      a second light sensor array;
      at least one linear multiple stage amplifier coupled to receive an output of the first light sensor array and to produce a plurality of amplified first signals from the output of the first light sensor, each of the amplified first signals having a different gain;
      at least one linear multiple stage amplifier coupled to receive an output of the second light sensor array and to produce a plurality of amplified second signals from the output of the second light sensor, each of the amplified second signals having a different gain; and
   a control system coupled to receive each of the amplified first signals and each of the amplified second signals and configured to process the amplified first signals and the amplified second signals to determine whether light incident upon the first light sensor array and the second light sensor array is from a laser beam emitted by the laser tool,
   wherein the control system is configured to process the amplified first signals and the amplified second signals to identify a stage of the first and the second linear multiple stage amplifiers that produces amplified signals with the highest signal-to-noise ratio and to use the amplified signals from the identified stage for the measurement signal
   wherein the at least one multiple stage amplifier coupled to receive an output of the first light sensor array includes a first linear multiple stage amplifier coupled to receive a first output from a first end of the first light sensor array and a second linear multiple stage amplifier coupled to receive a second output from a second end of the first light sensor array,
   wherein the at least one multiple stage amplifier coupled to receive an output of the second light sensor array includes a third linear multiple stage amplifier coupled to receive a first output from a first end of the second light sensor array and a fourth linear multiple stage amplifier coupled to receive a second output from a second end of the second light sensor array,
   wherein the first, second, third, and fourth linear multiple stage amplifiers each include a transimpedance amplifier, and
   wherein a light compensator is associated with each of the transimpedance amplifiers, the light compensators being configured to output signals indicating an intensity and/or distribution of sunlight on the first and the second light sensor arrays.

5. The receiving unit of claim 4, wherein the control system is configured to scale a bandwidth of the measurement signal based on the identified stage.

6. The receiving unit of claim 4, wherein the optical window includes an optical filter configured to pass only light of a predetermined wavelength or range of wavelengths.

7. The receiving unit of claim 4, further comprising:
   a lens for spreading light received via the optical window so the light is incident upon both the first and the second light sensor array.

* * * * *